(12) United States Patent
Lee et al.

(10) Patent No.: US 11,069,536 B2
(45) Date of Patent: Jul. 20, 2021

(54) DEVICE MANUFACTURING METHOD

(71) Applicant: TOKYO ELECTRON LIMITED, Tokyo (JP)

(72) Inventors: Sunghil Lee, Gyeonggi-do (KR); Tatsuya Yamaguchi, Nirasaki (JP); Nagisa Sato, Tokyo (JP); Syuji Nozawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/679,865

(22) Filed: Nov. 11, 2019

(65) Prior Publication Data

US 2020/0152478 A1 May 14, 2020

(30) Foreign Application Priority Data

Nov. 14, 2018 (JP) .............................. JP2018-214071

(51) Int. Cl.
  *H01L 21/47* (2006.01)
  *H01L 21/477* (2006.01)
  *H01L 21/02* (2006.01)

(52) U.S. Cl.
  CPC ...... *H01L 21/477* (2013.01); *H01L 21/02008* (2013.01); *H01L 2221/68381* (2013.01)

(58) Field of Classification Search
  CPC ...................... H01L 21/477; H01L 29/66545
  See application file for complete search history.

(56) References Cited

U.S. PATENT DOCUMENTS 9,177,874 B2 * 11/2015 Patzer .................... H01L 22/12
2019/0206718 A1 * 7/2019 LiCausi ............ H01L 21/76828

FOREIGN PATENT DOCUMENTS

JP       2007-36018 A       2/2007

* cited by examiner

*Primary Examiner* — William Coleman
(74) *Attorney, Agent, or Firm* — Nath, Goldberg & Meyer; Jerald L. Meyer; Tanya E. Harkins

(57) ABSTRACT

There is provided a method of manufacturing a device, which comprises: a preparation step of preparing a workpiece having a recess formed therein; a burying step of burying a sacrificial material composed of a thermally decomposable organic material in the recess; a lamination step of laminating a preliminary sealing film on the sacrificial material buried in the recess; a first removal step of removing the sacrificial material in the recess through the preliminary sealing film, by annealing the workpiece at a first temperature and thermally decomposing the sacrificial material; a processing step of performing a predetermined process on a portion other than the recess in the workpiece, in a state in which the recess is covered with the preliminary sealing film; and a second removal step of removing the preliminary sealing film.

6 Claims, 10 Drawing Sheets

_US 11,069,536 B2_

DEVICE MANUFACTURING METHOD

CROSS-REFERENCE TO RELATED APPLICATION

This application is based upon and claims the benefit of priority from Japanese Patent Application No. 2018-214071, filed on Nov. 14, 2018, the entire contents of which are incorporated herein by reference.

TECHNICAL FIELD

Various aspects and embodiments of the present disclosure relate to a device manufacturing method.

BACKGROUND

In an analog semiconductor integrated circuit device having a sensor and a power management function, there may be a case where a plurality of transistors having different threshold voltages are provided to cope with processing of complex analog signals and various input voltages. For example, the threshold voltage of the transistor may be controlled by controlling the thickness of a gate electrode layer.

For example, in a case where a plurality of transistors having different threshold values are provided on a substrate, gate electrode films are laminated in all transistors on the substrate (a lamination step). Further, some of the transistors are protected by a mask material, and the gate electrode films of the transistors which are not protected by the mask material are removed by etching or the like (a removal step). Further, the mask material is removed, and in a subsequent lamination step, gate electrode films are laminated on all transistors on the substrate. By repeating the lamination step and the removal step, the transistors on which gate electrode films of different thicknesses are laminated are formed.

PRIOR ART DOCUMENT

Patent Documents

Patent Document 1: Japanese Laid-Open Patent Publication No. 2007-036018

SUMMARY

According to an embodiment of the present disclosure, there is provided a method of manufacturing a device, the method including: a preparation step of preparing a workpiece having a recess formed therein; a burying step of burying a sacrificial material composed of a thermally decomposable organic material in the recess; a lamination step of laminating a preliminary sealing film on the sacrificial material buried in the recess; a first removal step of removing the sacrificial material in the recess through the preliminary sealing film, by annealing the workpiece at a first temperature and thermally decomposing the sacrificial material; a processing step of performing a predetermined process on a portion other than the recess in the workpiece, in a state in which the recess is covered with the preliminary sealing film; and a second removal step of removing the preliminary sealing film.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, embodiments of a device manufacturing method of the present disclosure will be described below in detail with reference to the drawings. Further, the device manufacturing method of the present disclosure is not limited by the following embodiments. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a case where a recess is present in a structure on a substrate, such as a transistor, a mask material is buried in the recess. The mask material is removed by a dry etching process or the like. In a case where the recess is deep or an aspect ratio of the recess is high, it is difficult for etchants such as ions or radicals to reach the bottom of the recess. This makes it difficult to sufficiently remove the mask material from the recess. Thus, residues of the mask material may be present on the bottom of the recess. When residues of the mask material are present in the recess, the residues may hinder etching of gate electrode films of transistors, which makes it difficult to control the thicknesses of the gate electrode films as designed.

There may be a case in which it is difficult to sufficiently remove a mask material even if a device has a recess formed therein and performs a predetermined process on another area while protecting a specific area with the mask material, other than the device having gate electrode films of different thicknesses. Examples of the predetermined process may include a film forming process, an etching process, a modifying process based on plasma irradiation, an ion implanting process, an impurity doping process and the like.

Accordingly, the present disclosure provides a technology for manufacturing a device, which is capable of protecting a recess and reducing residues present in the recess during processing of a workpiece having the recess.

[Device Manufacturing Method]

Figure 1:
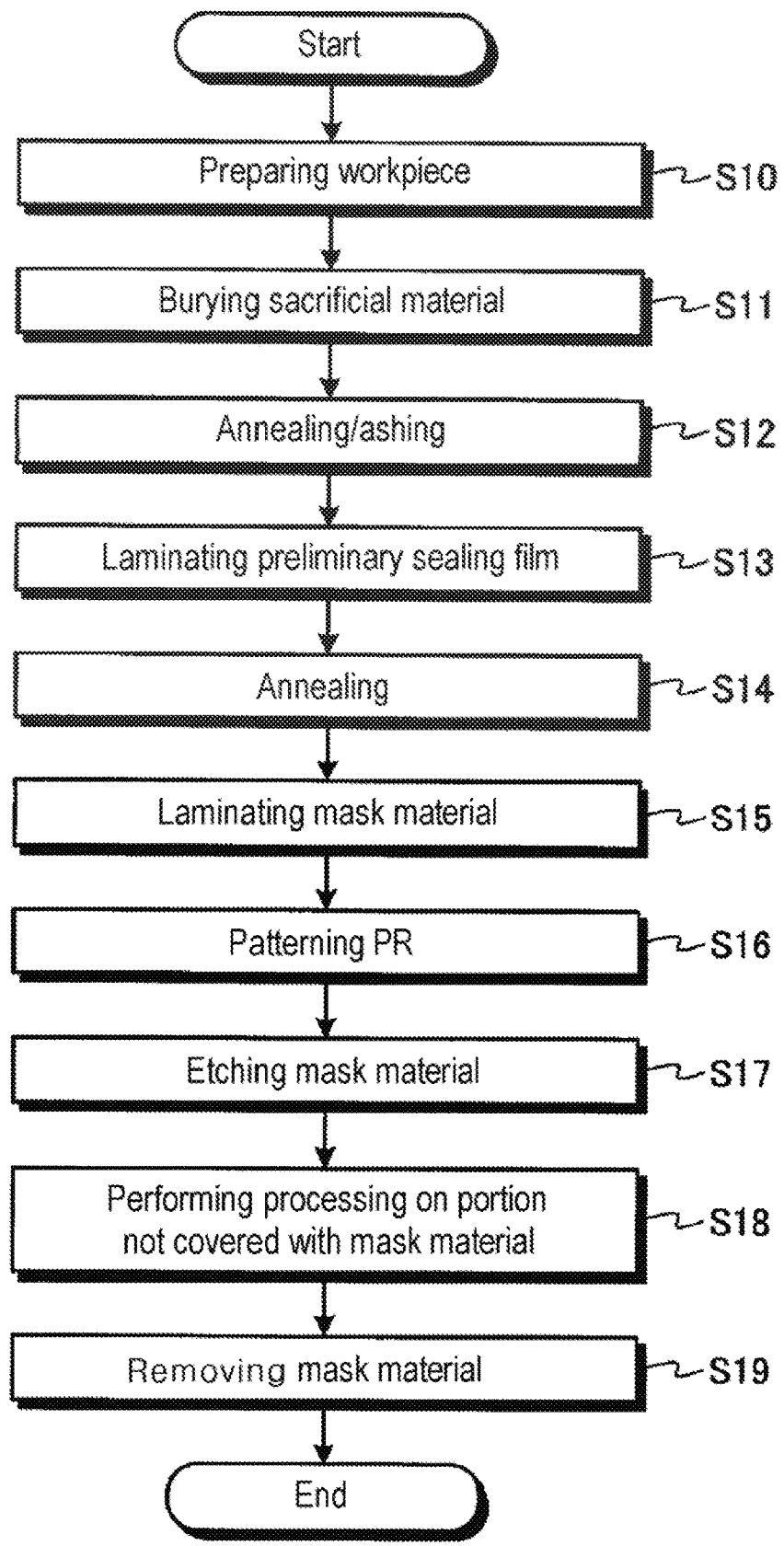
FIG. 1 is a flowchart illustrating an example of a device manufacturing method according to an embodiment of the present disclosure.

FIG. 1 is a flowchart illustrating an example of a device manufacturing method according to an embodiment of the present disclosure. In the flowchart illustrated in FIG. 1, a method of producing a plurality of transistors having different threshold voltages, which are included in a device, is illustrated.

Figure 2:
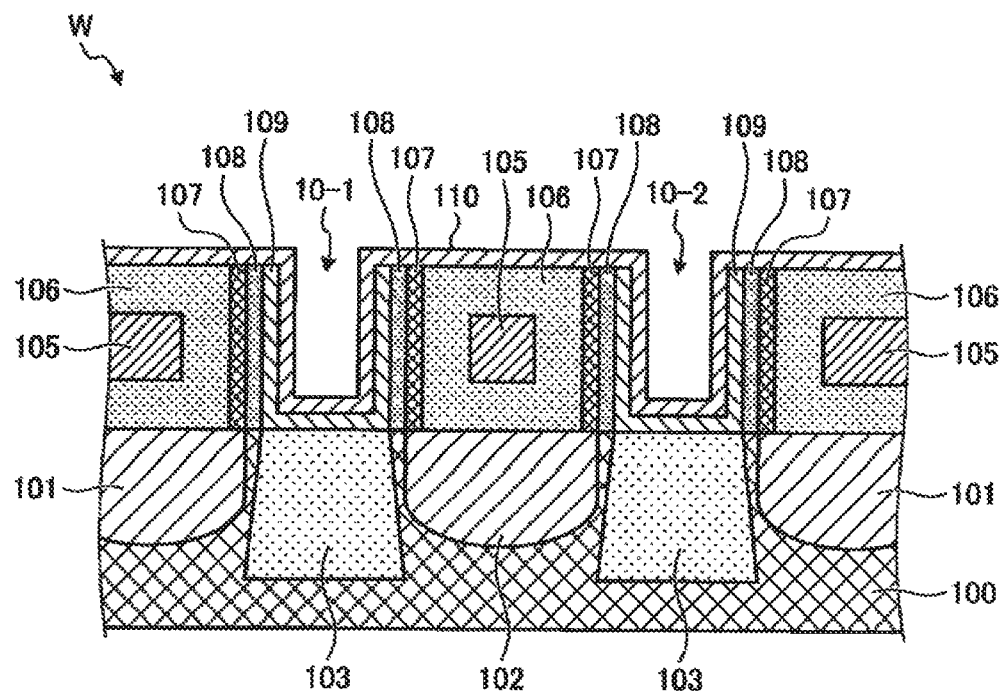
FIG. 2 is a cross-sectional view illustrating an example of a workpiece used in the device manufacturing method.

First, for example, a workpiece W as illustrated in FIG. 2 is prepared (step S10). Step S10 is an example of a preparation step. FIG. 2 is a cross-sectional view illustrating an example of the workpiece W used for manufacturing the device. In the workpiece W, for example, as illustrated in FIG. 2, a plurality of silicon nitride films 106 are laminated on a silicon substrate 100 to surround each silicon oxide film 105. A source area 101, a drain area 102, and a channel area 103 are formed in the silicon substrate 100. A first recess 10-1 and a second recess 10-2 are formed between the silicon nitride films 106 adjacent to each other. Hereinafter, the first recess 10-1 and the second recess 10-2 may be collectively referred to sometimes as a recess 10 unless there is a need to distinguish them from one another.

A spacer film 107 composed of SiOCN or the like, a silicon nitride film 108, and a high-permittivity film 109 composed of $HfO_2$ or the like are laminated in sequence on a sidewall inward of each recess 10. Further, a gate electrode film 110 composed of TiN or the like is laminated on the entire workpiece W.

Figure 3:
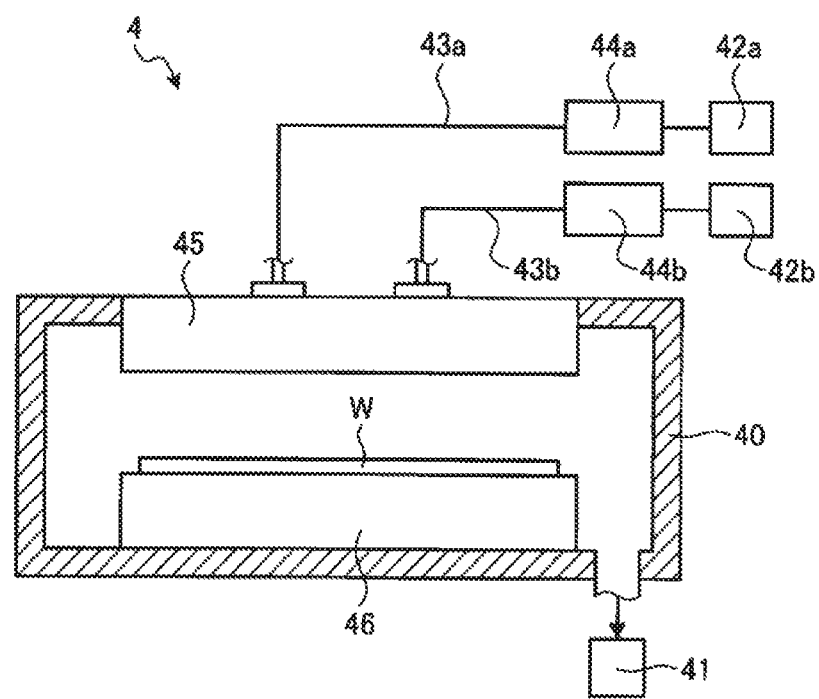
FIG. 3 is a schematic cross-sectional view illustrating an example of a burying apparatus.

Subsequently, a sacrificial material composed of a thermally decomposable organic material is buried in each recess 10 by using, for example, a burying apparatus 4 illustrated in FIG. 3. Step S1 is an example of a burying step. FIG. 3 is a schematic cross-sectional view illustrating an example of the burying apparatus 4. In the present embodiment, the burying apparatus 4 may be a chemical vapor deposition (CVD) apparatus.

The burying apparatus 4 includes a container 40 and an exhaust device 41. The exhaust device 41 exhausts gas in the container 40. The interior of the container 40 is kept in a predetermined vacuum atmosphere by the exhaust device 41.

A material source 42a that accommodates isocyanate that is an example of a material monomer remaining in a liquid state, is coupled to the container 40 through a supply pipe 43a. Further, a material source 42b that accommodates amine that is an example of a material monomer remaining in a liquid state, is coupled to the container 40 through a supply pipe 43b. Isocyanate and amine are composed of an organic material, and are examples of monomers for generating a thermally decomposable sacrificial material.

The liquid isocyanate supplied from the material source 42a is vaporized by a vaporizer 44a installed in the supply pipe 43a. Further, isocyanate vapor is introduced into a shower head 45 as a gas discharging part through the supply pipe 43a. Further, the liquid amine supplied from the material source 42b is vaporized by a vaporizer 44b installed in the supply pipe 43b. Further, the vapor of amine is introduced into the shower head 45.

For example, the shower head 45 is provided in an upper portion of the container 40, and has a plurality of discharge holes formed in a lower surface thereof. The shower head 45 discharges the vapor of isocyanate introduced through the supply pipe 43a and the amine vapor is introduced through the supply pipe 43b from the discharge holes into the container 40 in the form of a shower.

A stage 46 including a temperature control mechanism (not illustrated) is provided inside the container 40. The workpiece W is mounted on the stage 46. The temperature control mechanism of the stage 46 controls a temperature of the workpiece W such that the temperature of the workpiece W becomes a predetermined temperature. The temperature control mechanism of the stage 46 controls the temperature of the workpiece W such that the temperature of the workpiece W becomes a temperature that is suitable for a vapor deposition polymerization of the material monomers supplied from the material source 42a and the material source 42b. The temperature that is suitable for the vapor deposition polymerization is determined based on the material monomer. In the present embodiment, the stage 46 controls the temperature of the workpiece W to fall within a range of, for example, 40 to 150 degrees C. As an example, the stage 46 controls the temperature of the workpiece W such that it becomes, for example, 80 degrees C.

Figure 4:
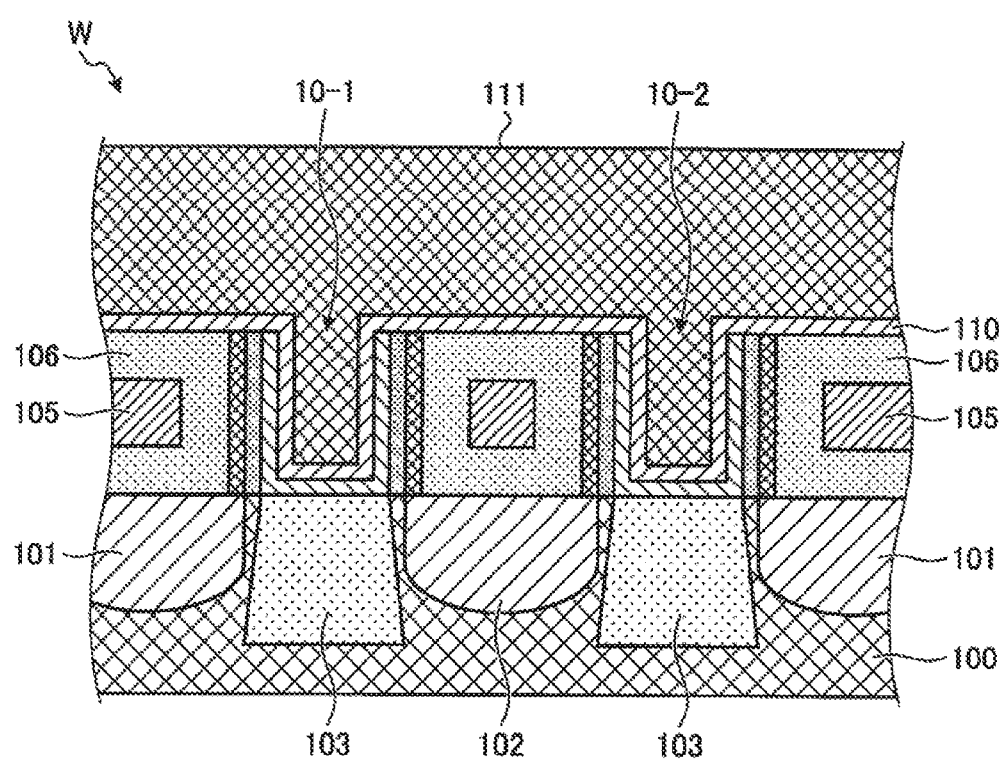
FIG. 4 is a cross-sectional view illustrating an example of a workpiece after a sacrificial material is buried in each recess.

By using the burying apparatus 4, two kinds of material monomers undergo a reaction of vapor deposition polymerization on a front surface of the workpiece W. As a result, for example, as illustrated in FIG. 4, a sacrificial material 111 of a polymer is buried in each recess 10 of the workpiece W. FIG. 4 is a cross-sectional view illustrating an example of the workpiece W after the sacrificial material 111 is buried in each recess 10. In the present embodiment, the sacrificial material 111 may be a polymer having a urea bond. For example, in the case where two kinds of material monomers are isocyanate and amine, the sacrificial material 111 may be a polyurea.

Figure 5A:
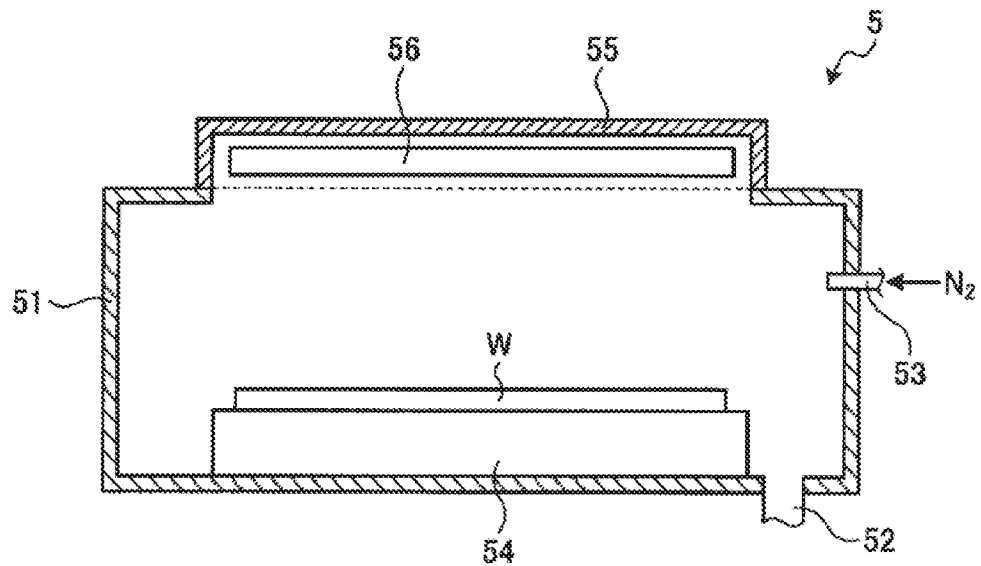
FIG. 5A is a schematic cross-sectional view illustrating an example of an annealing apparatus.

Subsequently, the workpiece W in which the sacrificial material 111 is buried in each recess 10 may be loaded onto an annealing apparatus 5 illustrated in FIG. 5A, where the workpiece W is subjected to annealing (S12). FIG. 5A is a schematic cross-sectional view illustrating an example of the annealing apparatus 5. The annealing apparatus 5 includes a container 51 and an exhaust pipe 52. An inert gas is supplied into the container 51 through a supply pipe 53. In the present embodiment, an example of the inert gas may be a nitrogen ($N_2$) gas. Gas in the container 51 is exhausted from the exhaust pipe 52. In the present embodiment, the interior of the container 51 is kept in a normal atmospheric pressure. In some embodiments, the interior of the container 51 may be kept in a vacuum.

A stage 54 on which the workpiece W is mounted is provided inside the container 51. A lamp house 55 is provided at a location that faces a surface of the stage 54, on which the workpiece W is mounted. An infrared ray lamp 56 is disposed inside the lamp house 55.

In the state in which the workpiece W is mounted on the stage 54, the inert gas is supplied into the container 51. Further, the workpiece W is heated by turning on the infrared ray lamp 56. When the sacrificial material 111 buried in each recess 10 of the workpiece W has a temperature at which depolymerization reaction should occur, the sacrificial material 111 is depolymerized into two kinds of material monomers. In the present embodiment, since the sacrificial material 111 is a polyurea, the sacrificial material 111 is depolymerized into isocyanate and amine that are the material monomers, by heating the workpiece W at 250 degrees C. or more. The depolymerization proceeds more quickly as the temperature becomes higher.

In step S12, the workpiece W is heated to a predetermined temperature by the annealing apparatus 5. An example of the predetermined temperature may be within a range of 250 degrees C. to 300 degrees C. In the present embodiment, the workpiece W may be heated to 260 degrees C. In step S12, the predetermined temperature set in step S12 is a second temperature. The heating in step S12 may be performed for several tens of minutes. Accordingly, a portion of the sacrificial material 111 is removed from each recess 10.

Figure 5B:
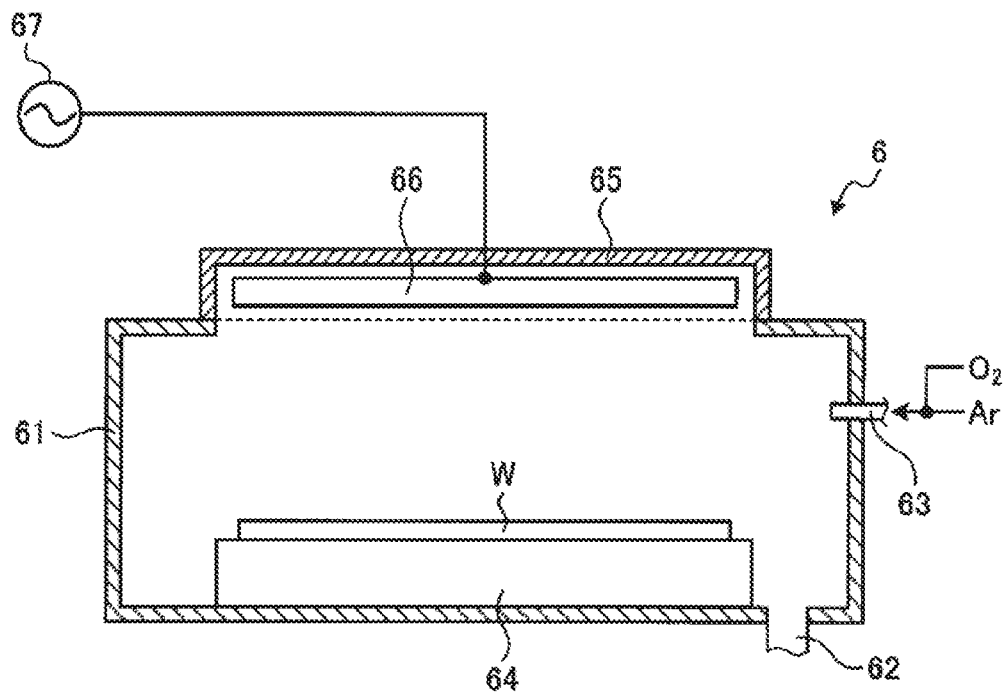
FIG. 5B is a schematic cross-sectional view illustrating an example of an ashing apparatus.

In some embodiments, the process in step S12 may be realized by using an ashing apparatus 6 as illustrated in FIG. 5B. FIG. 5B is a schematic cross-sectional view illustrating an example of the ashing apparatus 6. The ashing apparatus 6 includes a container 61 and an exhaust pipe 62. An Ar gas or an oxygen ($O_2$) gas is supplied into the container 61 through a supply pipe 63. Gas in the container 61 is exhausted from the exhaust pipe 62. In the present embodiment, the interior of the container 61 is kept in a normal atmospheric pressure. In some embodiments, the interior of the container 61 may be kept in a vacuum.

A lower electrode 64 is provided inside the container 61. The workpiece W is mounted on the lower electrode 64. A housing 65 is provided at a location that faces a surface of the lower electrode 64, on which the workpiece W is mounted. An upper electrode 66 is disposed inside the housing 65. A high-frequency power source 67 is connected to the upper electrode 66.

After the workpiece W is mounted on the lower electrode 64, the Ar gas is supplied into the container 61. Further, a high-frequency power at a predetermined frequency is applied to the upper electrode 66 from the high-frequency power source 67 so that plasma of the Ar gas is excited inside the container 61. After the plasma of the Ar gas is excited, $O_2$ gas is further supplied into the container 61. Thus, the sacrificial material 111 buried in each recess 10 of the workpiece W is ashed (carbonized) so that a portion of the sacrificial material 111 is removed from each recess 10.

Figure 6:
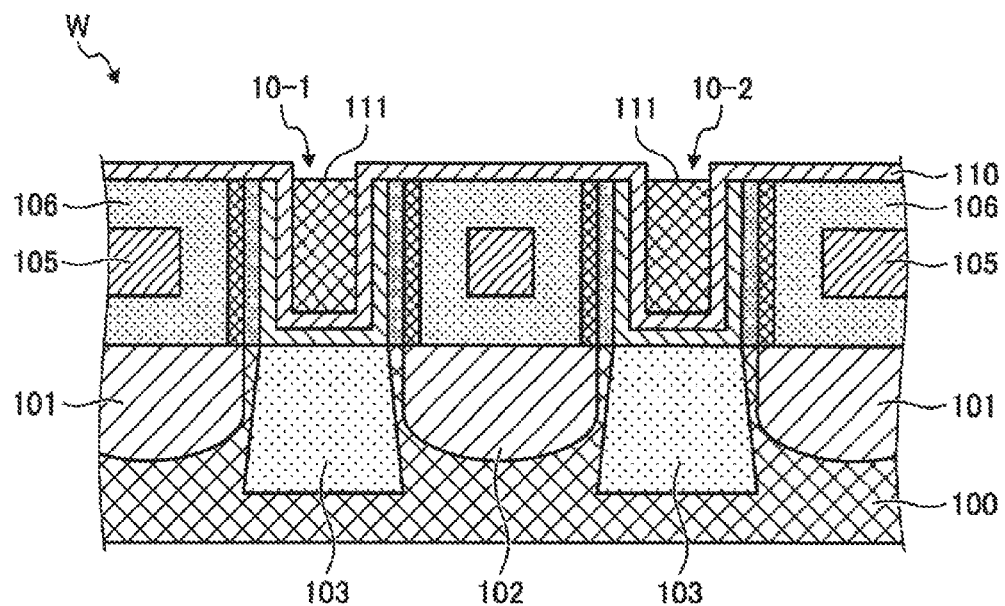
FIG. 6 is a cross-sectional view illustrating an example of the workpiece after a portion of the sacrificial material is removed.

After the process in step S12 is performed, for example, the workpiece W comes into a state as illustrated in FIG. 6. FIG. 6 is a cross-sectional view illustrating an example of the workpiece W after a portion of the sacrificial material 111 has been removed. For example, as illustrated in FIG. 6, an upper portion of the sacrificial material 111 is removed by the depolymerization so that the sacrificial material 111 at a portion other than each recess 10 is removed. If the sacrificial material 111 laminated on the portion other than the recess 10 is still present, the sacrificial material 111 is removed through annealing (to be described later). In this case, a gap is formed in the upper surface of the gate electrode film 110. An etching solution may penetrate through the gap. Accordingly, it is preferable to perform the annealing until the sacrificial material 1 on the upper surface of the gate electrode film 110 is removed. If the annealing is sufficiently performed until the sacrificial material 111 on the upper surface of the gate electrode film 110 is removed, for example, as illustrated in FIG. 6, a thickness of the sacrificial material 111 in the recess 10 may become slightly smaller than a depth of the recess 10.

Further, when the sacrificial material 111 is a polyurea, the progress of the depolymerization is slower at the temperature ranging from 250 degrees C. to 300 degrees C., when compared with the case in which the workpiece W is heated to 300 degrees C. or more. Accordingly, by adjusting the heating time, it is possible to remove the sacrificial material 111 at the portion other than the recess 10 while leaving the sacrificial material 111 inside the recess 10.

Figure 7:
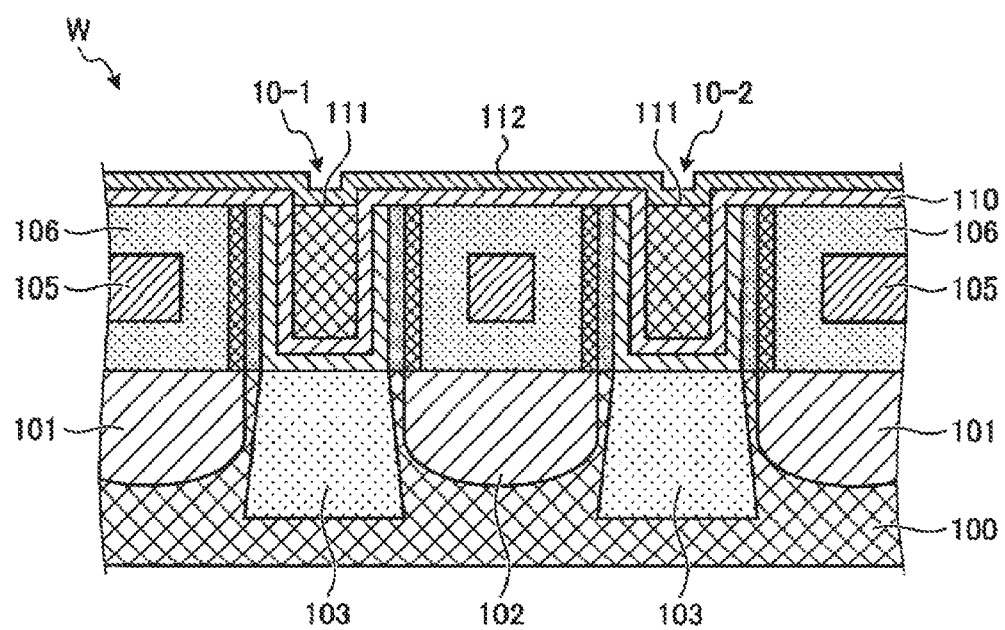
FIG. 7 is a cross-sectional view illustrating an example of the workpiece after a preliminary sealing film is laminated.

Subsequently, the workpiece W, from which the portion of the sacrificial material 111 has been removed, is loaded into a film forming apparatus (not illustrated) where, for example, as illustrated in FIG. 7, a preliminary sealing film 112 is laminated on the workpiece W (S13). Step S13 is an example of a lamination step. FIG. 7 is a cross-sectional view illustrating an example of the workpiece W after the preliminary sealing film 112 is laminated. The preliminary sealing film 112 is laminated on the workpiece W by, for example, an atomic layer deposition (ALD). In the present embodiment, the preliminary sealing film 112 is a low temperature oxide film (LTO) composed of $SiO_2$, and is a film sparsely formed relative to a thermal oxide film that is formed at a high temperature. The preliminary sealing film 112 may be laminated at a thickness of 3 nm to 5 nm. In the present embodiment, the thickness of the preliminary sealing film 112 may be 3 nm.

Subsequently, the workpiece W, on which the preliminary sealing film 112 is laminated, is loaded into the annealing apparatus 5 illustrated in FIG. 5A, where the workpiece W is annealed (S14). In step S14, the workpiece W is heated to a predetermined temperature by the annealing apparatus 5. The predetermined temperature may fall within a range of 300 degrees C. or more. In the present embodiment, the workpiece W may be heated at 400 degrees C.

The predetermined temperature set in step S14 is an example of a first temperature. The heating in step S14 may be performed for several minutes. As a result, all of sacrificial material 111 buried in each recess 10 is depolymerized. The depolymerization is an example of thermal decomposition.

Figure 8:
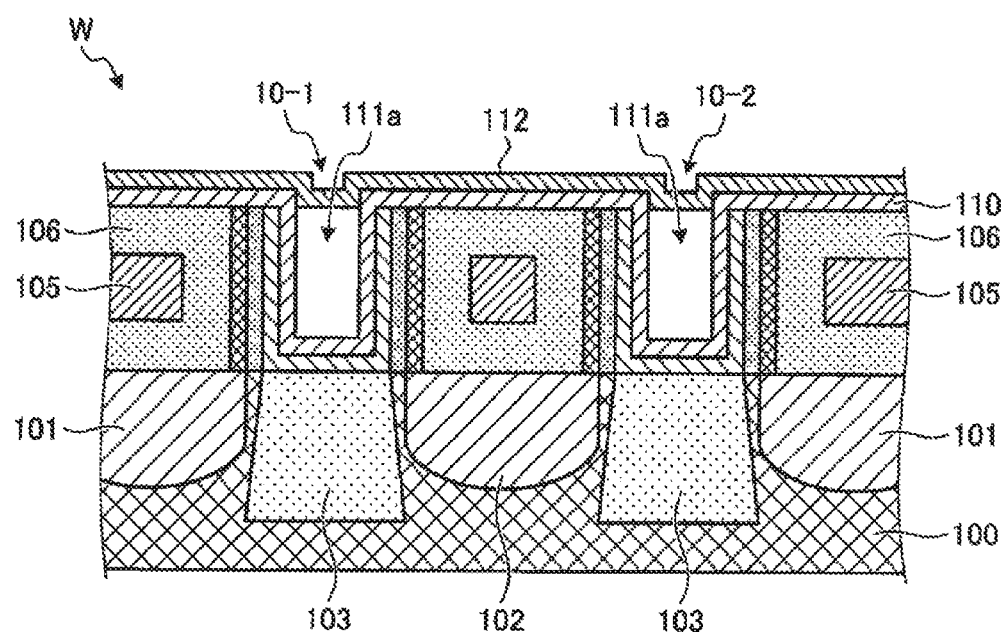
FIG. 8 is a cross-sectional view illustrating an example of the workpiece after the sacrificial material is removed.

Further, as the isocyanate and amine generated through the depolymerization passes through the preliminary sealing film 112 that is the sparsely formed film, they are desorbed from the recess 10 under the preliminary sealing film 112. Accordingly, the sacrificial material 111 is removed from the recess 10 under the preliminary sealing film 112. For example, as illustrated in FIG. 8, a cavity 111a is formed in each recess 10 under the preliminary sealing film 112. FIG. 8 is a cross-sectional view illustrating an example of the workpiece W after the portion of the sacrificial material 111 has been removed. Step S14 is an example of a first removal process.

Subsequently, the workpiece W, from which the sacrificial material 111 has been removed, is loaded into the film forming apparatus (not illustrated) where a mask material 113 such as a bottom anti-reflective coating (BARC) is laminated on the workpiece W (S15). The mask material 113 is formed on the workpiece W through a spin coating or the like.

Figure 9:
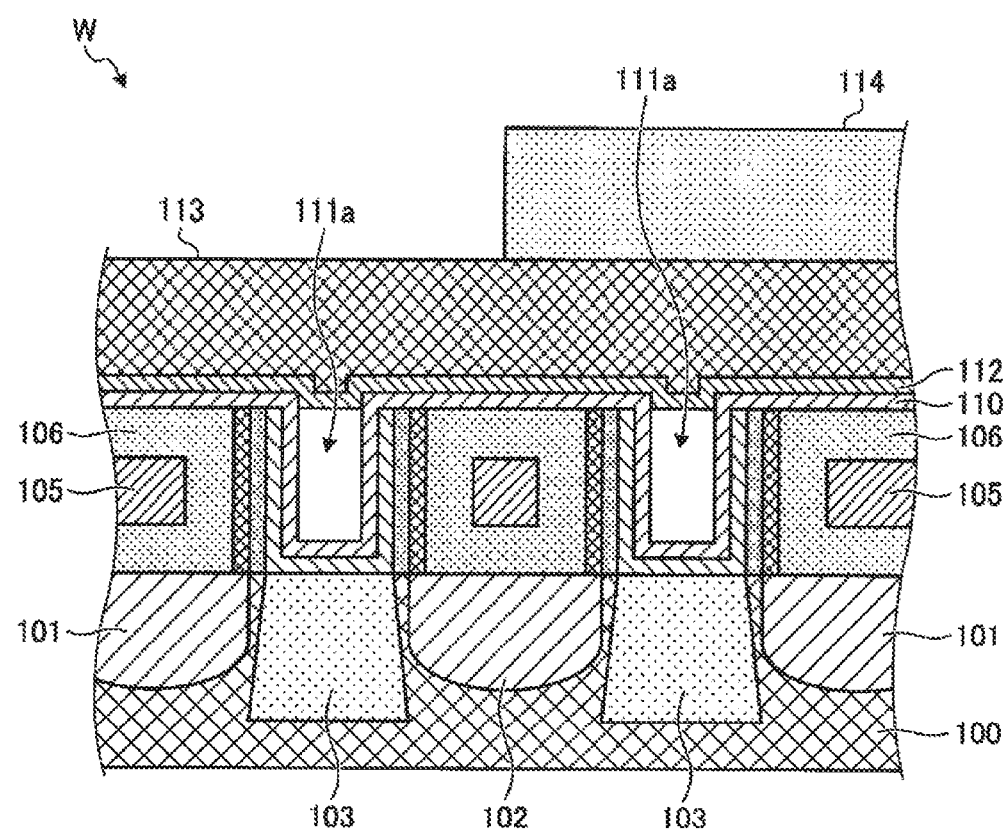
FIG. 9 is a cross-sectional view illustrating an example of the workpiece after a mask material and a PR are laminated.

Subsequently, a photoresist (PR) 114 is laminated on the mask material 113. For example, as illustrated in FIG. 9, the PR 114 is patterned to have a predetermined pattern (S16). FIG. 9 is a cross-sectional view illustrating an example of the workpiece W after the mask material 113 and the PR 114 are laminated.

Figure 10:
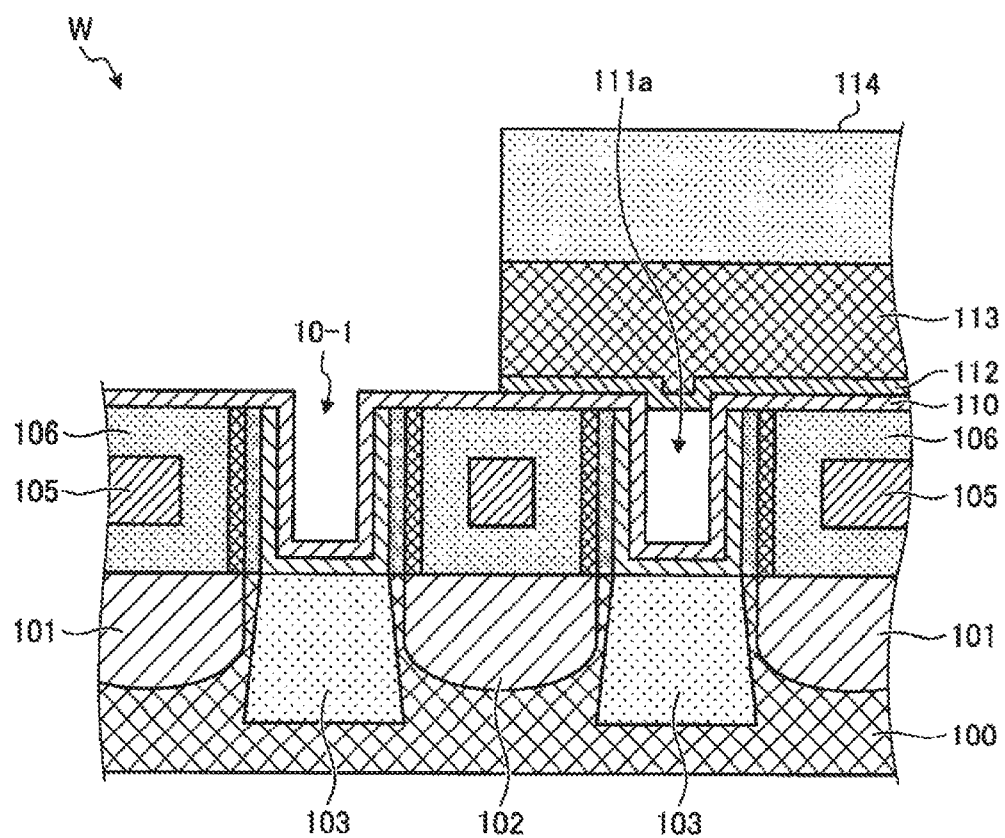
FIG. 10 is a cross-sectional view illustrating an example of the workpiece after the mask material and the preliminary sealing film are etched.

Subsequently, the workpiece W, on which the PR 114 is patterned, is loaded into a dry etching apparatus (not illustrated) where the mask material 113 and the preliminary sealing film 112 are removed by dry etching using the PR 114 as a mask (S17). As a result, for example, a cross-section of the workpiece W is as illustrated in FIG. 10. FIG. 10 is a cross-sectional view illustrating an example of the workpiece W after the mask material 113 and the preliminary sealing film 112 are etched away.

Figure 11:
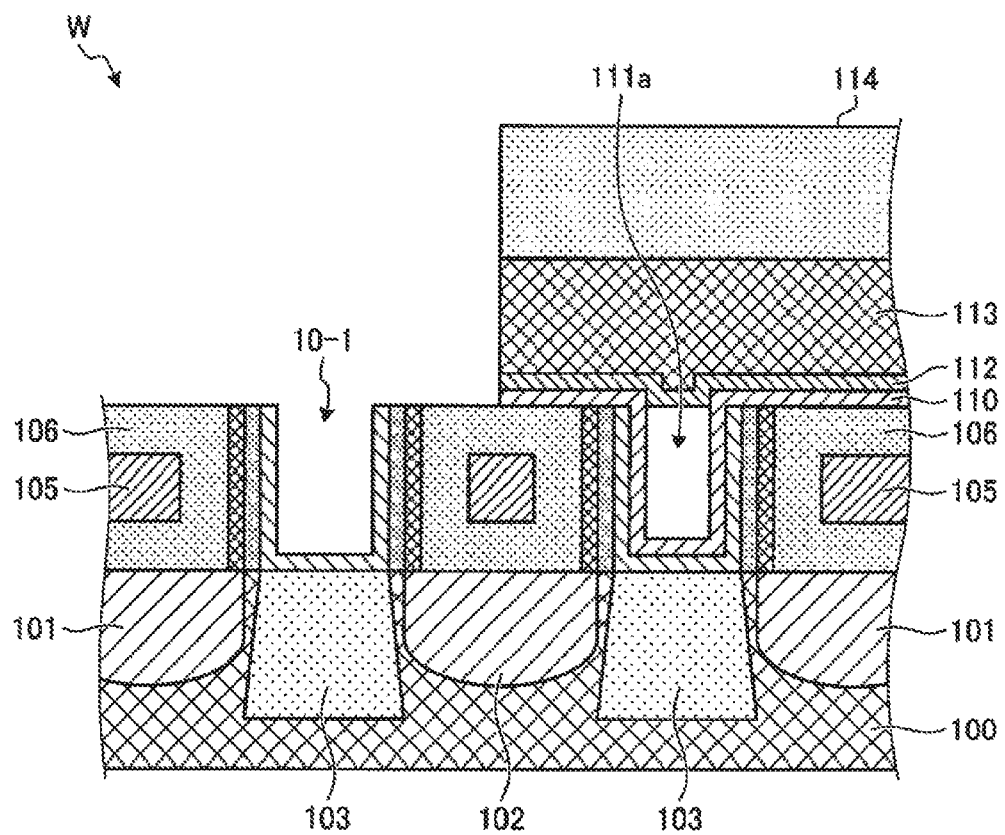
FIG. 11 is a cross-sectional view illustrating an example of the workpiece after a gate electrode film of a first recess is removed.

Subsequently, the workpiece W in which the mask material 113 is patterned is loaded into a processing apparatus (not illustrated) where a predetermined process is performed on a portion of the workpiece W, which is not covered with the mask material 113 (S18). Step S18 is an example of a processing step. In the present embodiment, the predetermined process is a process of etching the gate electrode film 110 of a portion of the workpiece W, which is not covered with the mask material 113 and the preliminary sealing film 112, through a wet etching. As a result, an example of the cross-section of the workpiece W is as illustrated in FIG. 11. FIG. 11 is a cross-sectional view illustrating an example of the workpiece W after the gate electrode film 110 of the first recess 10-1 is removed. In some embodiments, the predetermined process may include a process, such as a film formation, a plasma irradiation-based modification, an ion implantation, an impurity doping or the like, which is performed on the portion of the workpiece W not covered with the mask material 113.

Figure 12:
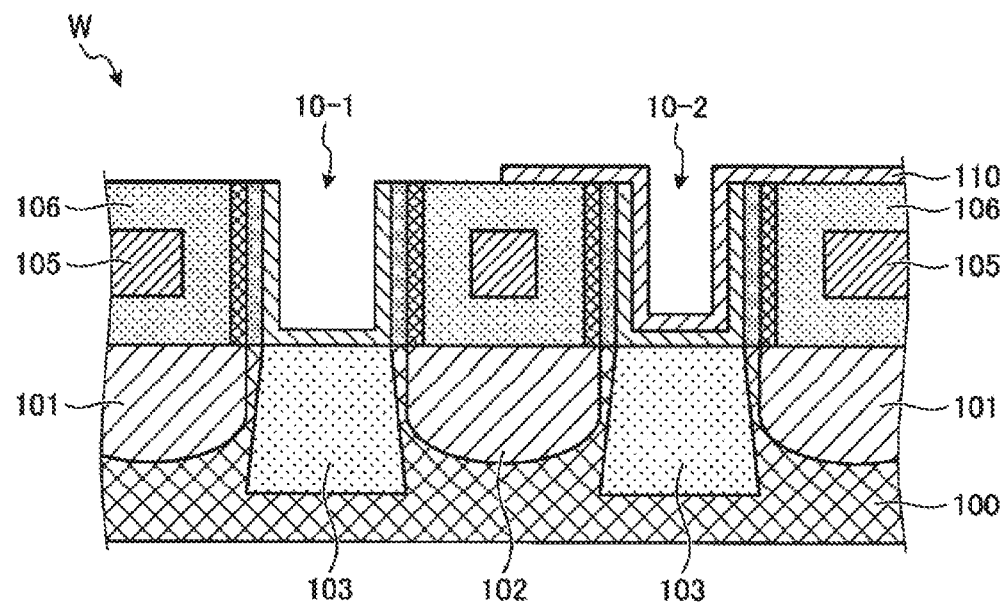
FIG. 12 is a cross-sectional view illustrating an example of the workpiece after a PR, a mask material, and a preliminary sealing film in a second recess are removed.

Subsequently, the workpiece W which has been subjected to the predetermined process, is loaded into an ashing apparatus (not illustrated) where the PR 114, the mask material 113, and the preliminary sealing film 112 are removed by ashing (S19). Step S19 is an example of a second removal process. As a result, an example of the cross-section of the workpiece W is as illustrated in FIG. 12. FIG. 12 is a cross-sectional view illustrating an example of the workpiece W after the PR 114, the mask material 113, and the preliminary sealing film 112 on the second recess 10-2 are removed. In this way, the device manufacturing method illustrated in FIG. 1 is completed.

By repeating the device manufacturing method illustrated in FIG. 1 while changing the pattern of the PR 114, it is possible to form a plurality of transistors having the gate electrode film 110 of different thicknesses on the silicon substrate 100.

Figure 13:
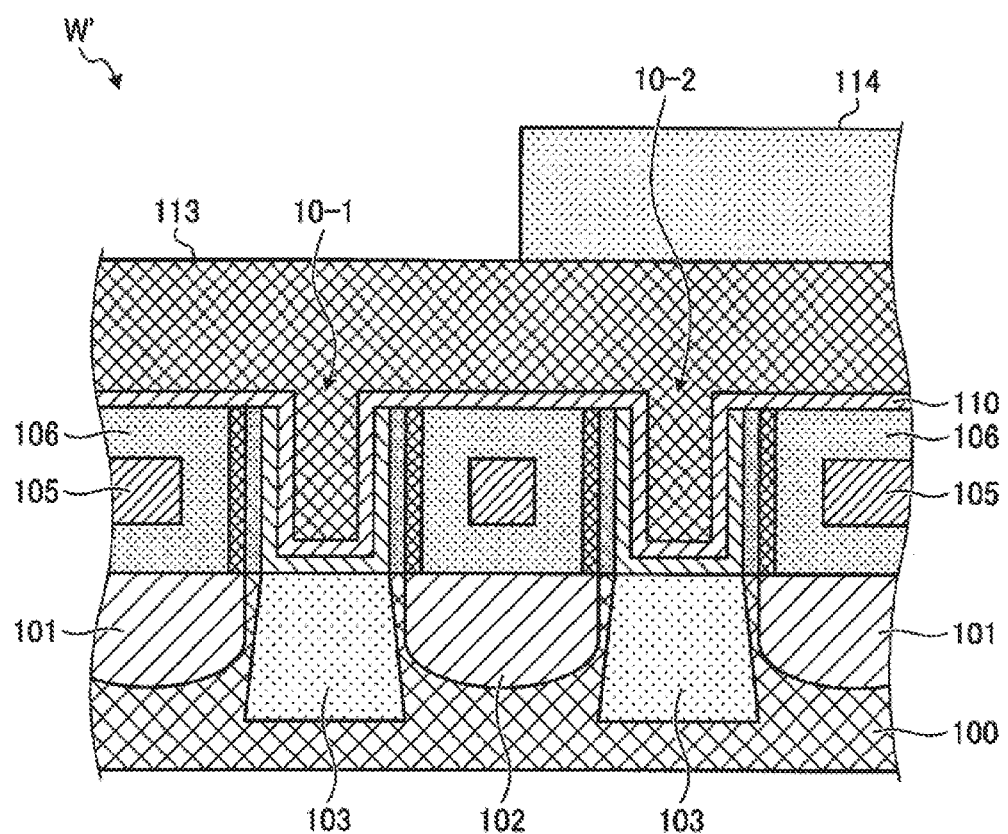
FIG. 13 is a cross-sectional view illustrating an example of a workpiece after a mask material and a PR are laminated in a comparative example.

It is considered that each recess 10 is protected by filling each recess 10 with the mask material 113 instead of the sacrificial material 111. In this case, the mask material 113 is filled in each recess 10, and the PR 114 is laminated on the mask material 113, so that the PR 114 is patterned to have a predetermined pattern. As a result, for example, the cross-section of a workpiece W' is as illustrated in FIG. 13. FIG. 13 is a cross-sectional view illustrating an example of the workpiece W' after the mask material 113 and the PR 114 are laminated, in a comparative example.

Figure 14:
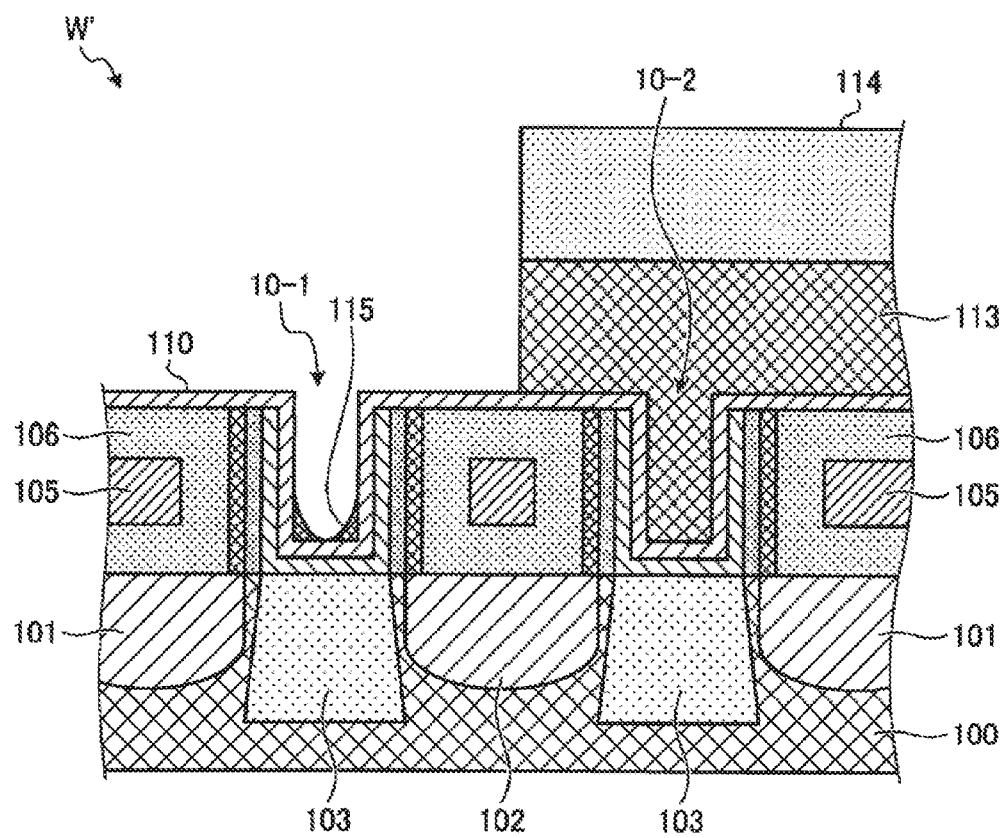
FIG. 14 is a cross-sectional view illustrating an example of the workpiece after a mask material and a preliminary sealing film are etched in a comparative example.

Subsequently, the mask material 113 and the preliminary sealing film 112 are etched away using the PR 114 as a mask. However, in a case where the first recess 10-1 is deep or the aspect ratio of the first recess 10-1 is high, it is difficult for etchants such as ions or radicals to reach the bottom of the first recess 10-1. Accordingly, for example, as illustrated in FIG. 14, residues 115 of the mask material 113 may be generated inside the first recess 10-1. FIG. 14 is a cross-sectional view illustrating an example of the workpiece W' after the mask material 113 and the preliminary sealing film 112 are etched, in the comparative example.

If the residues 115 are generated in the recess 10, when removing the gate electrode film 110 in the recess 10 by a wet etching using the mask material 113 as a mask, the residues 115 hamper etching of the gate electrode film 110 in the recess 10. Accordingly, it may be difficult to sufficiently remove the gate electrode film 110 in the recess 10. This makes it difficult to form a transistor having the gate electrode film 110 of a designed thickness on the silicon substrate 110.

In contrast, in the device manufacturing method according to the present embodiment, each recess 10 is filled with the sacrificial material 111 composed of a thermally decomposable organic material. The workpiece W is heated in the state where the sacrificial material 111 in the recess 10 is covered with the preliminary sealing film 112. Accordingly, the sacrificial material 111 in the recess 10 is decomposed, passes through the preliminary sealing film 112 as a sparsely formed film, and is separated from the recess 10. Thus, the cavity 111a is formed in each recess 10. Further, the preliminary sealing film 112 around the opening of the recess 10 is removed by etching or the like. This makes it possible to prevent a material for protecting the recess 10 with respect to the predetermined process from being formed as residues in the recess 10.

In the above, the device manufacturing method according to an embodiment has been described. The device manufacturing method according to the present embodiment includes the preparation step, the burying step, the lamination step, the first removal step, the processing step, and the second removal step. In the preparation step, the workpiece W having each recess 10 is prepared. In the burying step, the sacrificial material composed of a thermally decomposable organic material is buried in each recess 10. In the lamination step, the preliminary sealing film 112 is laminated on the sacrificial material 111 buried in each recess 10. In the first removal step, the sacrificial material 111 is thermally decomposed by annealing the workpiece W at the first temperature, so that the sacrificial material 111 in the recess 10 is removed through the preliminary sealing film 112. In the processing step, in the state in which each recess 10 is covered with the preliminary sealing film 112, the predetermined process is performed on a portion other than the recess 10 in the workpiece W. In the second removal step, the preliminary sealing film 112 is removed. Accordingly, in the processing of the workpiece W having the recess 10 formed therein, it is possible to protect the recess 10 and reduce the generation of the residues in the recess 10.

Further, in the burying step of the embodiment, after the sacrificial material 111 is buried in the recess 10 by laminating the sacrificial material 111 on the upper surface of the workpiece W, the workpiece W is annealed at the second temperature lower than the first temperature. Thus, the sacrificial material 111 on the upper surface of the workpiece W, except for the recess 10, is removed by the thermal decomposition. Accordingly, when removing the sacrificial material 111 by the annealing, it is possible to prevent an etching solution from being penetrated through a gap formed in the upper surface of the workpiece W.

Further, in the above embodiment, the first temperature is a temperature not less than 300 degrees C., and the second temperature is a temperature that falls within a range from 250 degrees C. to less than 300 degrees C. The sacrificial material 111 in the recess 10 can be sufficiently depolymerized by heating the workpiece W at the temperature of 300 degrees C. or more, which makes it possible to desorb the sacrificial material 111 from the recess 10 through the preliminary sealing film 112. Further, by heating the workpiece W at the temperature that falls within a range from 250 degrees C. to less than 300 degrees C. it is possible to remove the sacrificial material 111 existing at a portion other than the recess 10 while leaving the sacrificial material 111 in the recess 10, through the adjustment of the heating time.

Further, in the above embodiment, the sacrificial material 111 is a polymer having a urea bond produced by the polymerization of plural kinds of monomers. Accordingly, it is possible to easily produce the sacrificial material 111, and easily remove the sacrificial material 111 through heating.

[Others]

Further, the technology disclosed in the present disclosure is not limited to the above embodiment, and various modifications may be made within the scope of the present disclosure.

For example, although a polyurea has been described to be used as the sacrificial material 111 in the above embodiment, any organic material may be used as long as it can be thermally decomposed. An example of the thermally decomposable organic material may include polyurethane, acryl resin, polyolefin, polycarbonate, polyamide, phenol resin, a thermally vaporizable low-molecular material or the like, in addition to the polyurea. Further, the thermally decomposable organic material may be buried in each recess 10 of the workpiece W through coating.

Further, although the method of manufacturing the device including the plurality of transistors having different threshold voltages has been described as an example in the above embodiment, the technology of the present disclosure is not limited thereto. For example, the technology of the present disclosure may be applied to a method of manufacturing a device having a plurality of recesses 10 formed therein, the method including a step of performing a predetermined process on another recesses 10 while protecting one recess 10, and a step of performing another process on one recess 10 while protecting another recesses 10.

Further, although the device in which the plurality of transistors are formed in the silicon substrate 100 of a planar shape has been described as an example in the above embodiment, the technology of the present disclosure is not limited thereto. For example, the technology of the present disclosure also may be applied in manufacturing a device having a 3-dimensional structure, such as a Fin-FET (field effect transistor).

According to various aspects and embodiments of the present disclosure, it is possible to protect a recess and reduce generation of residues in the recess when processing a workpiece having the recess formed therein.

It should be noted that the embodiments disclosed herein are exemplary in all respects and are not restrictive. In practice, the embodiment can be realized in various forms. The above-described embodiments may be omitted, replaced or modified in various forms without departing from the scope and spirit of the appended claims.

What is claimed is:

1. A method of manufacturing a device, the method comprising:
  a preparation step of preparing a workpiece having a recess formed therein;
  a burying step of burying a sacrificial material composed of a thermally decomposable organic material in the recess;
  a lamination step of laminating a preliminary sealing film on the sacrificial material buried in the recess;
  a first removal step of removing the sacrificial material in the recess through the preliminary sealing film, by annealing the workpiece at a first temperature and thermally decomposing the sacrificial material,
  a processing step of performing a predetermined process on a portion other than the recess in the workpiece, in a state in which the recess is covered with the preliminary sealing film; and
  a second removal step of removing the preliminary sealing film.

2. The method of claim 1, wherein the burying step further comprises:
  laminating the sacrificial material on an upper surface of the workpiece to bury the sacrificial material in the recess; and
  subsequently, annealing the workpiece at a second temperature lower than the first temperature to remove the sacrificial material on the upper surface of the workpiece other than the recess through a thermal decomposition.

3. The method of claim 1, wherein the burying step further comprises:
  laminating the sacrificial material on an upper surface of the workpiece to bury the sacrificial material in the recess; and
  subsequently, exposing the workpiece to an oxygen plasma to remove the sacrificial material on the upper surface of the workpiece other than the recess through an ashing.

4. The method of claim 1, wherein the sacrificial material is a polymer having a urea bond, which is produced by a polarization of plural kinds of monomers.

5. The method of claim 2, wherein the first temperature is a temperature of 300 degrees C. or more, and the second temperature is a temperature that falls within a range from 250 degrees C. to less than 300 degrees C.

6. The method of claim 5, wherein the sacrificial material is a polymer having a urea bond, which is produced by a polarization of plural kinds of monomers.

* * * * *